United States Patent
Kobayashi et al.

(10) Patent No.: US 7,755,254 B2
(45) Date of Patent: Jul. 13, 2010

(54) HONEYCOMB-TYPE PIEZOELECTRIC/ELECTROSTRICTIVE ELEMENT

(75) Inventors: Nobuyuki Kobayashi, Nagoya (JP); Tsutomu Nanataki, Toyoake (JP)

(73) Assignee: NGK Insulators, Ltd., Nagoya (JP)

( * ) Notice: Subject to any disclaimer, the term of this patent is extended or adjusted under 35 U.S.C. 154(b) by 392 days.

(21) Appl. No.: 11/940,662

(22) Filed: Nov. 15, 2007

(65) Prior Publication Data

US 2008/0129156 A1 Jun. 5, 2008

(30) Foreign Application Priority Data

Dec. 4, 2006 (JP) ............................. 2006-326926
Oct. 22, 2007 (JP) ............................. 2007-273838

(51) Int. Cl.
*H01L 41/08* (2006.01)
(52) U.S. Cl. ....................................... 310/328; 310/365
(58) Field of Classification Search ......... 310/363–366, 310/328
See application file for complete search history.

(56) References Cited

U.S. PATENT DOCUMENTS

| | | | |
|---|---|---|---|
| 5,252,883 A | 10/1993 | Kondo | |
| 5,325,011 A * | 6/1994 | Kahn et al. | 310/358 |
| 6,522,052 B2 | 2/2003 | Kihara et al. | |
| 6,806,622 B1 * | 10/2004 | Schmidt et al. | 310/334 |
| 7,382,082 B2 * | 6/2008 | Bhardwaj | 310/357 |
| 2009/0122941 A1 * | 5/2009 | Engemann et al. | 376/145 |
| 2009/0227909 A1 * | 9/2009 | Schafer et al. | 601/2 |

FOREIGN PATENT DOCUMENTS

| | | |
|---|---|---|
| JP | 06-120579 A1 | 4/1994 |
| JP | 11-112046 A1 | 4/1999 |
| JP | 2002-261339 A1 | 9/2002 |
| JP | 2004-297042 A1 | 10/2004 |

* cited by examiner

*Primary Examiner*—J. SanMartin
(74) *Attorney, Agent, or Firm*—Burr & Brown

(57) ABSTRACT

A honeycomb-type piezoelectric/electrostrictive element includes a honeycomb structure section having a partition wall which partitions cells passing through the honeycomb structure section in an axial direction, and an electrode as an internal electrode disposed on an inner wall surface of the cell to internally cover the entire inner wall surface, wherein the partition wall is formed of a piezoelectric/electrostrictive body, and the honeycomb structure section can be deformed by applying a voltage between the electrodes disposed in the cells adjacent through the partition wall.

20 Claims, 9 Drawing Sheets

HONEYCOMB-TYPE PIEZOELECTRIC/ELECTROSTRICTIVE ELEMENT

BACKGROUND OF THE INVENTION

1. Field of the Invention

The present invention relates to a honeycomb-type piezoelectric/electrostrictive element. More particularly, the present invention relates to a honeycomb-type piezoelectric/electrostrictive element which exhibits excellent durability, is suitable for weight reduction, and can be produced at low cost.

2. Description of Related Art

A fast-response piezoelectric actuator is used as a fuel injection valve actuator for a diesel engine and a precise positioning actuator. A piezoelectric actuator generally has an extremely large generative force of about 3 kg/mm$^2$, but produces a small displacement of about 0.1 mm or less. Therefore, measures for increasing the displacement of the piezoelectric actuator have been tried.

As an actuator having the increased displacement, at the moment, there is mainly proposed a stacked piezoelectric actuator in which thin piezoelectric sheets provided with an electrode are stacked and unified (see patent documents 1 to 3, for example). An actuator having a vortex structure is also proposed (see patent document 4, for example). Among them, a stacked actuator is generally formed using the following method. First, an unfired tape (sheet) with a thickness of several tens of micrometers is formed using a doctor blade method or the like, and is cut to appropriate dimensions to obtain a green sheet. Next, an electrode paste containing a metal such as Pt or Ag/Pd which can withstand the piezoelectric sintering temperature is printed on one side of the green sheet as an internal electrode metal paste, and several hundreds of green sheets are stacked. After removing the binder, the resulting unfired laminate is fired (sintered) at 1000° C. or more. After cutting the sintered body to the desired dimensions and shape, each internal electrode is connected to an external electrode provided to the side surface of the sintered body to obtain a stacked actuator.

[Patent document 1] JP-A-6-120579

[Patent document 2] JP-A-2002-261339

[Patent document 1] JP-A-2004-297042

[Patent document 4] JP-A-11-112046

In such a stacked actuator, generally, an inactive region (inactive portion) in which the electrode is not formed exists in the peripheral portion of each layer. Since a tensile stress due to driving and deformation of the active portion occurs in the inactive portion, cracking or the like occurs, resulting in deterioration in durability. To solve this problem, a stacked actuator having a configuration in which an electrode is formed over the entire surface is proposed. However, such a stacked actuator requires a complicated step of providing a coating formed of an insulating material almost over the entire width of the edge of the internal electrode exposed on the side surface (see patent document 1). Moreover, the external electrode connecting the electrode between the layers tends to break due to tensile stress caused by the expansion/contraction movement of the actuator. This also results in deterioration in durability. Therefore, a complicated step such as attaching a metal mesh is required (see patent document 2). Since a stacked actuator tends to undergo delamination or the like due to shear stress which occurs between the piezoelectric layer and the electrode layer, it is necessary to operate the stacked actuator while applying an appropriate preload (see patent document 3).

Since a lead-containing piezoelectric material with a specific gravity of about 8 is generally used for a stacked actuator, the mass of the stacked actuator tends to be increased when forming a dense bulk structure. A cylindrical actuator is also proposed in order to ensure the displacement area and the displacement magnitude while suppressing an increase in mass. However, there is a problem that the processing cost increases when the aspect ratio of the element is increased.

A stacked actuator is generally produced by a large number of steps, resulting in an increase in cost. In the stacked actuator production process, the piezoelectric material and the internal electrode are generally fired at the same time. Therefore, it is necessary to use a material containing an expensive noble metal such as Pt or Ag/Pd with a heat resistance of 1000° C. or more for the electrode, resulting in an increase in cost.

A actuator having a vortex structure is proposed in order to improve the durability of the stacked actuator (see patent document 4). In this actuator having a vortex structure, a piezoelectric ceramic layer and a vibrating electrode are wound in a vortex shape to form an approximately cylindrical shape. This vortex structure is advantageous as compared with the stacked structure in terms of durability. However, problems of a large mass and a high production cost have not been improved.

SUMMARY OF THE INVENTION

The present invention has been achieved in view of the above-described problems. An object of the present invention is to provide a honeycomb-type piezoelectric/electrostrictive element which exhibits excellent durability, is suitable for providing weight reduction, and can be produced at low cost.

In order to achieve the above object, the present invention provides the following honeycomb-type piezoelectric/electrostrictive element.

According to a first aspect of the present invention, a honeycomb-type piezoelectric/electrostrictive element is provided, comprising a honeycomb structure section having a partition wall which partitions cells passing through the honeycomb structure section in an axial direction, and an electrode (internal electrode) disposed on an inner wall surface of the cell to internally cover the entire inner wall surface, wherein the partition wall is formed of a piezoelectric/electrostrictive body, and the honeycomb structure section can be deformed by applying a voltage between the electrodes disposed in the cells adjacent through the partition wall.

According to a second aspect of the present invention, the honeycomb-type piezoelectric/electrostrictive element according to the first aspect is provided, wherein the internal electrodes are disposed in all of the cells so that a voltage can be applied between all of the cells adjacent through the partition wall.

According to a third aspect of the present invention, the honeycomb-type piezoelectric/electrostrictive element according to the first or second aspects if provided, further comprising an external electrode connected to predetermined internal electrodes of the same polarity and another external electrode connected to the remaining internal electrodes of the same polarity on one end face of the honeycomb structure section, wherein the external electrode and the other external electrode make up a pair of external electrodes for applying a voltage.

According to a fourth aspect of the present invention, the honeycomb-type piezoelectric/electrostrictive element according to the third aspect is provided, further comprising conductive plugging sections contacting the internal electrodes and provided on one end of the cells, wherein the external electrode and the other external electrode are respectively connected to the predetermined internal electrodes and the remaining internal electrodes through the plugging sections.

According to a fifth aspect of the present invention, the honeycomb-type piezoelectric/electrostrictive element according to the first and second aspects is provided, wherein the honeycomb structure section includes an external electrode connected to predetermined internal electrodes of the same polarity on one end face and another external electrode connected to the remaining internal electrodes of the same polarity on the other end face, and the external electrode and the other external electrode make up a pair of external electrodes for applying a voltage.

According to a sixth aspect of the present invention, the honeycomb-type piezoelectric/electrostrictive element according to the fifth aspect if provided, further comprising conductive plugging sections contacting the internal electrodes and provided on ends of the cells in which the predetermined internal electrodes are disposed on the side on which the external electrode is disposed, the external electrode being connected to the predetermined internal electrodes through the plugging sections, and conductive plugging sections contacting the internal electrodes and provided on ends of the cells in which the remaining internal electrodes are disposed on the side on which the other external electrode is disposed, and the other external electrode being connected to the remaining internal electrodes through the plugging sections.

According to a seventh aspect of the present invention, the honeycomb-type piezoelectric/electrostrictive element according to the first and second aspects if provided, further comprising a wiring board including an external electrode corresponding to predetermined internal electrodes of the same polarity and another external electrode corresponding to the remaining internal electrodes of the same polarity, the wiring board being disposed on one end face of the honeycomb structure section in a state in which the predetermined internal electrodes and the external electrode corresponding to the predetermined internal electrodes are electrically connected and the remaining internal electrodes and the external electrode corresponding to the remaining internal electrodes are electrically connected, wherein the external electrode and the other external electrode make up a pair of external electrodes for applying a voltage.

According to an eighth aspect of the present invention, the honeycomb-type piezoelectric/electrostrictive element according to the first or second aspects is provided, further comprising external electrodes independently connected to the respective internal electrodes on one end face of the honeycomb structure section, wherein a voltage can be independently applied to the respective internal electrodes through the external electrodes.

According to a ninth aspect of the present invention, the honeycomb-type piezoelectric/electrostrictive element according to the fourth or sixth aspects is provided, further comprising a grid-shaped insulating protective film disposed along the partition wall on the end face of the honeycomb structure section on which the external electrode is disposed so that the insulating protective film covers the partition wall and the internal electrodes and exposes the plugging sections, wherein the external electrode is disposed on the surface of the insulating protective film and connected to the plugging sections exposed in openings in the grid-shaped insulating protective film.

According to a tenth aspect of the present invention, the honeycomb-type piezoelectric/electrostrictive element according to any one of the third to ninth aspects is provided, wherein the predetermined internal electrodes of the same polarity and the remaining internal electrodes of the same polarity are arranged alternately.

According to an eleventh aspect, the honeycomb-type piezoelectric/electrostrictive element according to any one of the first to tenth aspects is provided, wherein the cross-sectional shape of the cell perpendicular to its longitudinal direction is a quadrangle having corners rounded in an arc shape.

According to a twelfth aspect of the present invention, the honeycomb-type piezoelectric/electrostrictive element according to any one of the first to eleventh aspects is provided, wherein the partition wall has a thickness of 20 to 500 μm.

According to a thirteenth aspect of the present invention, the honeycomb-type piezoelectric/electrostrictive element according to any one of the first to twelfth aspects is provided, wherein the honeycomb structure section is formed by extruding a raw material for forming containing a piezoelectric/electrostrictive material as a main component, and firing the extruded product.

According to a fourteenth aspect of the present invention, the honeycomb-type piezoelectric/electrostrictive element according to any one of the first to thirteenth aspects is provided, wherein the honeycomb structure section is formed by stacking green sheets containing a piezoelectric/electrostrictive material as a main component, and firing the stacked green sheets.

According to a fifteenth aspect of the present invention, the honeycomb-type piezoelectric/electrostrictive element according to any one of the first to fourteenth aspects is provided, wherein the internal electrode has a thickness of 0.05 to 5 μm.

Since the honeycomb-type piezoelectric/electrostrictive element according to the present invention includes the honeycomb structure section having the partition wall formed of a piezoelectric/electrostrictive body and the internal electrodes provided on the inner wall surfaces of the cells partitioned by the partition wall, the partition wall can be deformed by applying a voltage between the internal electrodes disposed in the cells adjacent through the partition wall so that the partition wall expands in the thickness direction (d33 direction) and contracts in the direction perpendicular to the thickness direction (d31 direction). Since the partition wall is deformed to expand in its thickness direction and contract in the direction perpendicular to the thickness direction, the honeycomb-type piezoelectric/electrostrictive element contracts in the direction in which the cells pass through the honeycomb structure section (central axis direction), and contracts in a plane perpendicular to the direction in which the cells pass through the honeycomb structure section. The space formed by the cells is reduced when the partition wall expands in the thickness direction. As described above, since the honeycomb-type piezoelectric/electrostrictive element contracts in the directions including the direction in which the cells pass through the honeycomb structure section, by applying a voltage to the internal electrodes, the honeycomb-type piezoelectric/electrostrictive element can be used as an actuator or the like utilizing such characteristics.

Since the honeycomb-type piezoelectric/electrostrictive element according to the present invention has a small inactive portion as compared with a stacked actuator, the honeycomb-type piezoelectric/electrostrictive element exhibits excellent durability. Since the piezoelectric is not stacked on the internal electrode and has a monolithic structure, delamination is prevented which occurs due to shear stress occurring between layers during the expansion/contraction movement of a stacked actuator, whereby the honeycomb-type piezoelectric/electrostrictive element exhibits excellent durability without requiring preloading.

Also in the honeycomb-type piezoelectric/electrostrictive element according to the present invention, since the internal electrode is disposed on the inner wall surface of the cell, therefore, the internal electrode can be disposed after forming the honeycomb structure section including a piezoelectric/electrostrictive body. This prevents the internal electrode from being exposed to a high firing temperature. Therefore, an expensive noble metal such as Pt or Ag/Pd need not be used as the material for the internal electrode, whereby the honeycomb-type piezoelectric/electrostrictive element can be produced at low cost.

Additionally, the honeycomb-type piezoelectric/electrostrictive element according to the present invention includes a plurality of spaces formed by the cells, therefore, the weight of the honeycomb-type piezoelectric/electrostrictive element can be structurally reduced.

Moreover, the application of the honeycomb-type piezoelectric/electrostrictive element according to the present invention is not limited to an actuator. The honeycomb-type piezoelectric/electrostrictive element according to the present invention may also be used as sensor elements for various sensors such as an ultrasonic sensor, an acceleration sensor, an angular velocity sensor, an impact sensor, and a mass sensor.

BRIEF DESCRIPTION OF THE DRAWINGS

FIG. 4 is an oblique view showing a state in which the external electrodes are disposed on both end faces (one end face is not shown).

DESCRIPTION OF REFERENCE NUMERALS

1: honeycomb structure section; 2: cell; 2a: corner; 3: partition wall; 4: inner wall surface; 5, 5a, 5b: internal electrode; 6: outer circumferential wall; 7, 7a, 7b: external electrode; 11: plugging section; 12: insulating protective film; 13: opening; 21: green sheet; 22: through-hall; 23: honeycomb formed body; 31: substrate; 32: bonding surface; 33: through-hall; 34: surface; 35: wiring board; 41a, 41b: bonding surface-side external electrode; 42a, 42b: surface-side external electrode; 43a, 43b: terminal; 44: adhesive; 45: conductive material; 46: end face; 47: cell; 100: honeycomb-type piezoelectric/electrostrictive element; A: portion; and a1, a2, a3, a4, a5, a6, a7, a8: arrow.

DETAILED DESCRIPTION OF THE INVENTION

Preferred embodiments of the present invention are described below in detail with reference to the drawings. Note that the present invention is not limited to the following embodiments. Various modifications and improvements of the design may be appropriately made without departing from the scope of the present invention based on knowledge of a person having ordinary skill in the art.

Figure 1A:
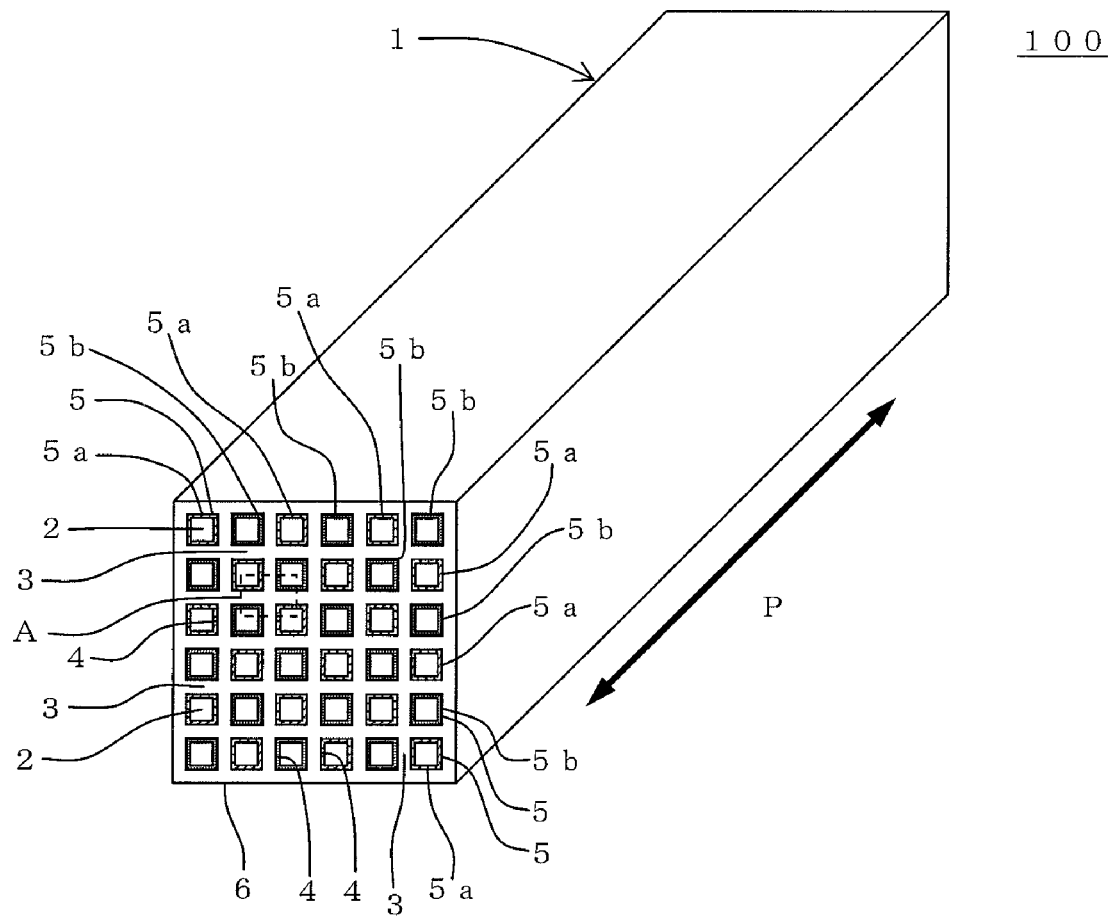
FIG. 1A is an oblique view schematically showing one embodiment of a honeycomb-type piezoelectric/electrostrictive element according to the present invention.
Figure 1B:
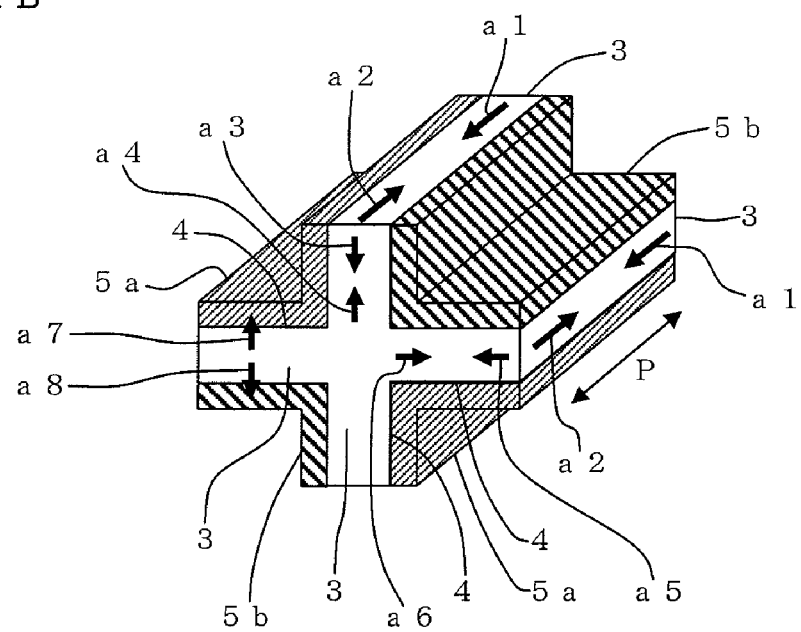
FIG. 1B is an enlarged oblique view showing a portion A in FIG. 1A.

FIGS. 1A and 1B schematically show one embodiment of a honeycomb-type piezoelectric/electrostrictive element according to the present invention. FIG. 1A is an oblique view, and FIG. 1B is an enlarged oblique view showing a portion A in FIG. 1A. As shown in FIGS. 1A and 1B, a honeycomb-type piezoelectric/electrostrictive element 100 according to this embodiment includes a honeycomb structure section 1 having a partition wall 3 which partitions cells 2 passing through the honeycomb structure section 1 in an axial direction (central axis direction) P, and an electrode (internal electrode) 5 disposed on an inner wall surface 4 of the cell 2 to internally cover the entire inner wall surface 4. The inner wall surface 4 of the cell 2 is the surface of the partition wall 3 forming the cell 2. The partition wall 3 is formed of a piezoelectric/electrostrictive body, and the honeycomb structure section can be deformed by applying a voltage between the electrodes (internal electrodes) 5 disposed in the cells 2 adjacent through the partition wall 3.

Since the partition wall 3 is formed of a piezoelectric/electrostrictive body and the internal electrode 5 is provided on the inner wall surface 4 of the cell 2, the partition wall 3 can be deformed by applying a voltage between the internal electrodes 5 disposed in the cells 2 adjacent through the partition wall 3, that is the partition wall 3 expands in the thickness direction (d33 direction) and contracts in the direction perpendicular to the thickness direction (d31 direction). As shown in FIG. 1B, for example, the central axis direction P of the honeycomb-type piezoelectric/electrostrictive element 100 corresponds to the direction perpendicular to the thickness direction of the partition wall 3, therefore the partition wall 3 is deformed to contract in the directions indicated by arrows a1 and a2. The partition wall 3 is also deformed to contract in the directions indicated by arrows a3 and a4 and arrows a5 and a6 in the direction perpendicular to the thickness direction of the partition wall 3 in a plane (end face and cross section) perpendicular to the central axis direction P of the honeycomb-type piezoelectric/electrostrictive element. Moreover, the partition wall 3 is deformed to expand in the directions indicated by arrows a7 and a8 in the thickness direction of the partition wall 3 in a plane (end face and cross section) perpendicular to the central axis direction P of the honeycomb-type piezoelectric/electrostrictive element. Since the partition wall 3 is deformed to expand in its thickness direction and contract in the direction perpendicular to the thickness direction, the honeycomb-type piezoelectric/electrostrictive element 100 contracts in the direction in which the cells 2 pass through the honeycomb structure section 1 (central axis direction P), and contracts in a plane perpendicular to the direction in which the cells 2 pass through the honeycomb structure section 1 (central axis direction P). Although the partition wall 3 is deformed to expand in its thickness direction, since the space formed by the cell 2 is formed in the thickness direction of the partition wall 3, deformation of the partition wall 3 in its thickness direction functions to reduce the space formed by the cell 2, and contributes to a change in the external shape of the honeycomb-type piezoelectric/electrostrictive element 100 to only a small extent. As described above, since the honeycomb-type piezoelectric/electrostrictive element 100 according to this embodiment contracts by applying a voltage to the internal electrodes in the directions including the direction in which the cells 2 pass through the honeycomb structure section 1 (central axis direction P). Accordingly, the honeycomb-type piezoelectric/electrostrictive element 100 can be used as an actuator element or a sensor element utilizing such characteristics.

In the honeycomb-type piezoelectric/electrostrictive element 100 according to this embodiment, since the cells 2 in which the internal electrode 5 is disposed are disposed over the entire plane (end face and cross section) perpendicular to the central axis direction P, an inactive portion is small as compared with a stacked actuator, whereby the honeycomb-type piezoelectric/electrostrictive element 100 exhibits excellent durability. Since the piezoelectric (partition wall 3 (piezoelectric/electrostrictive body)) is not stacked on the internal electrode 5 and has a monolithic structure, delamination which occurs due to shear stress occurring between layers during the expansion/contraction movement of a stacked actuator is prevented, whereby the honeycomb-type piezoelectric/electrostrictive element 100 exhibits excellent durability without requiring preloading. In the honeycomb-type piezoelectric/electrostrictive element 100 according to this embodiment, since the internal electrode 5 is disposed on the inner wall surface 4 of the cell 2, the internal electrode 5 can be disposed after forming the honeycomb structure section 1 including the piezoelectric/electrostrictive body (partition wall 3). This prevents the internal electrode 5 from being exposed to a high firing temperature when forming the honeycomb structure section 1. Therefore, an expensive noble metal such as Pt or Ag/Pd need not be used as the material for the internal electrode 5, whereby the honeycomb-type piezoelectric/electrostrictive element 100 can be produced at low cost. Since the honeycomb-type piezoelectric/electrostrictive element 100 according to this embodiment includes the space formed by the cells 2, the weight of the honeycomb-type piezoelectric/electrostrictive element 100 can be reduced.

The partition wall 3 of the honeycomb structure section 1 constituting the honeycomb-type piezoelectric/electrostrictive element 100 according to this embodiment is formed of a piezoelectric/electrostrictive body. The piezoelectric/electrostrictive material for the piezoelectric/electrostrictive body is not particularly limited insofar as the material produces an electric-field-induced strain. The piezoelectric/electrostrictive material may be either crystalline or amorphous, and may be a semiconductor ceramic material, a ferroelectric ceramic material, or an antiferroelectric ceramic material. The piezoelectric/electrostrictive material may be appropriately selected depending on the application. The piezoelectric/electrostrictive material may or may not require a polarization treatment.

Specific examples of the piezoelectric/electrostrictive material include lead zirconate, lead titanate, lead magnesium niobate, lead nickel niobate, lead nickel tantalate, lead zinc niobate, lead manganese niobate, lead antimony stannate, lead manganese tungstate, lead cobalt niobate, lead magnesium tungstate, lead magnesium tantalate, barium titanate, sodium bismuth titanate, bismuth neodymium titanate (BNT), sodium niobate, potassium sodium niobate, strontium bismuth tantalate, copper tungsten barium, bismuth ferrite, complex oxides of two or more or these compounds, and the like. An oxide of lanthanum, calcium, strontium, molybdenum, tungsten, barium, niobium, zinc, nickel, manganese, cerium, cadmium, chromium, cobalt, antimony, iron, yttrium, tantalum, lithium, bismuth, tin, copper, or the like may be dissolved in these materials. In particular, a material containing a complex oxide of lead zirconate, lead titanate, and lead magnesium niobate as the main component and containing nickel oxide, and a material containing a complex oxide of lead zirconate, lead titanate, lead magnesium niobate, and lead nickel niobate as the main component are preferable since a large electric-field-induced strain can be utilized. The term "main component" refers to a component of which the content is more than 50% by mass. A material containing a nickel component in an amount of 0.05 to 3% by mass in terms of an oxide is particularly preferable. A material prepared by adding lithium bismuthate, lead germanate, and the like to the above material is preferable since high material properties can be obtained while ensuring low-temperature firing of the piezoelectric/electrostrictive body. It is particularly desirable to use a material containing a complex oxide of lead zirconate, lead titanate, and lead magnesium niobate as the main component and containing nickel oxide in an amount of 0.05 to 3% by mass in terms of an oxide and lead germanate in an amount of 0.3 to 4% by mass or a material containing a complex oxide of lead zirconate, lead titanate, lead magnesium niobate, and lead nickel niobate as the main component and containing lead germanate in an amount of 0.3 to 4% by mass, wherein the material contains the nickel component in an amount of 0.05 to 3% by mass in terms of an oxide.

The honeycomb structure section 1 constituting the honeycomb-type piezoelectric/electrostrictive element 100 according to this embodiment includes an outer circumferential wall 6 disposed to surround the entire outermost circumference of the partition wall 3. The outer circumferential wall 6 may be formed of a piezoelectric/electrostrictive body, or may be formed of another ceramic material, whereas the partition wall 3 is formed of a piezoelectric/electrostrictive body.

The dimensions of the honeycomb-type piezoelectric/electrostrictive element 100 according to this embodiment are not particularly limited, and may be appropriately selected depending on the application. For example, when using the honeycomb-type piezoelectric/electrostrictive element 100 as a fuel injection valve actuator for an internal combustion engine, the cross-sectional area of the honeycomb-type piezoelectric/electrostrictive element 100 is preferably about 0.3 to 1.5 mm$^2$, and the length of the honeycomb-type piezoelectric/electrostrictive element 100 is preferably about 30 to 80 mm.

The thickness of the partition wall 3 of the honeycomb-type piezoelectric/electrostrictive element 100 according to this embodiment is not particularly limited. However, the thickness of the partition wall 3 is preferably 20 to 500 μm, more preferably 30 to 80 μm, and particularly preferably 30 to 50 μm. The thickness of the outer circumferential wall 6 (when provided) is preferably 50 to 200 μm.

In the case where the honeycomb-type piezoelectric/electrostrictive element 100 has a quadrangular honeycomb shape, when the thickness is A μm and the cell size is B μm, the ratio A/B is preferably 0.02 to 0.3, more preferably 0.04 to 0.2, and particularly preferably 0.06 to 0.1. The number of cells formed in the honeycomb-type piezoelectric/electrostrictive element 100 is preferably 10 to 1000 and more preferably 40 to 500.

Figure 2:
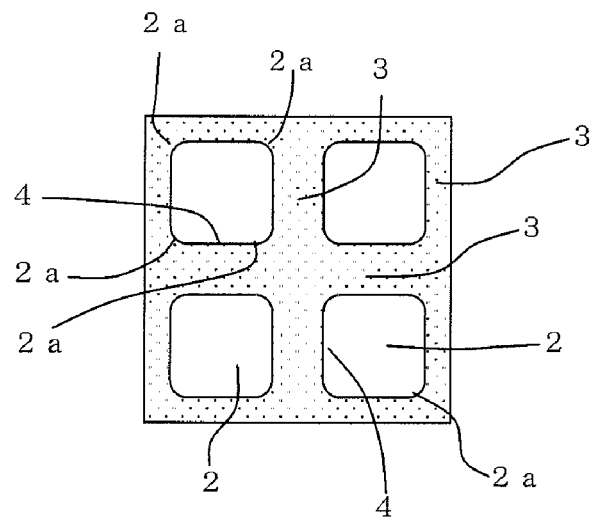
FIG. 2 is an enlarged cross-sectional view schematically showing part of the cross section of a honeycomb structure section forming another embodiment of the honeycomb-type piezoelectric/electrostrictive element according to the present invention perpendicular to the central axis.

In the honeycomb-type piezoelectric/electrostrictive element 100 according to this embodiment, the shape of the cross section of the honeycomb structure section 1 perpendicular to the central axis may be quadrangular, as shown in FIG. 1A. The shape of the cross section of the honeycomb structure section 1 may be another polygonal shape such as a pentagon or a hexagon, or may be another shape such as a circle, an ellipse, or a track shape. The shape of the cross section of the cell 2 perpendicular to the central axis (longitudinally perpendicular) may be quadrangular, as shown in FIG. 1A. The shape of the cross section of the cell 2 may be another polygonal shape such as a pentagon or a hexagon, or may be another shape such as a round-edged polygon (round-edged quadrangle, for example), a circle, an ellipse, or a track shape. The term "round-edged quadrangle" means that the cross-sectional shape of the cell 2 perpendicular to its longitudinal direction is in the shape of a quadrangle of which four corners (vertices) 2a are roundly formed in the shape of an arc, as shown in FIG. 2. Such a cell shape can prevent an electric field from being concentrated on the corner portions of the internal electrode disposed in the cell. FIG. 2 is an enlarged cross-sectional view showing part of the cross section perpendicular to the central axis of a honeycomb structure section constituting another embodiment of the honeycomb-type piezoelectric/electrostrictive element according to the present invention.

In the honeycomb-type piezoelectric/electrostrictive element 100 according to this embodiment, the honeycomb structure section 1 is preferably formed by extruding a raw material for forming containing a piezoelectric/electrostrictive material as the main component and firing the extruded product. This enables the honeycomb-type piezoelectric/electrostrictive element 100 to be efficiently fabricated with a reduced number of steps, whereby production cost can be reduced. The honeycomb structure section 1 may be formed by stacking green sheets containing a piezoelectric/electrostrictive material as the main component and firing the stacked green sheets. The term "containing a piezoelectric/electrostrictive material as the main component" means that the content of the piezoelectric/electrostrictive material with respect to the entire powder components of the raw material for forming exceeds 50% by mass.

In the honeycomb-type piezoelectric/electrostrictive element 100 according to this embodiment, the number of internal electrodes 5 disposed and the arrangement of the internal electrodes 5 are not particularly limited insofar as at least one partition wall 3 is sandwiched between the internal electrodes 5. As shown in FIG. 1A, it is preferable that the internal electrodes 5 be disposed in all the cells 2 so that a voltage can be applied between all the cells 2 adjacent through the partition wall 3. The internal electrode 5 is preferably formed in the shape of a tube to cover the entire inner wall surface of the cell 2. This allows the entire partition wall 3 to be deformed in predetermined directions described above when applying a voltage to the internal electrodes 5, whereby a piezoelectric/electrostrictive element capable of generating a large force can be provided. When the internal electrodes 5 are disposed in all the cells 2 and a voltage is applied between all the cells 2 adjacent through the partition wall 3, as shown in FIG. 1A, it is preferable to alternately dispose predetermined internal electrodes 5a of one polarity and the remaining internal electrodes 5b of another polarity, and to apply a voltage between the internal electrode 5a and the internal electrode 5b. The expression "the internal electrodes 5a and the internal electrodes 5b are alternately disposed" means that the internal electrodes 5a and the internal electrodes 5b are alternately disposed in the vertical direction and the horizontal direction on the end face, as shown in FIG. 1A.

The thickness of the internal electrode 5 of the honeycomb-type piezoelectric/electrostrictive element 100 according to this embodiment is not particularly limited. The thickness of the internal electrode 5 is preferably 0.05 to 5 μm, more preferably 0.1 to 1 μm, and particularly preferably 0.1 to 0.5 μm. If the thickness of the internal electrode 5 is below 0.05 μm, the resistance of the electrode increases, whereby a sufficient electric field may not be applied to the piezoelectric/electrostrictive body. If the thickness of the internal electrode 5 exceeds 5 μm, the internal electrode 5 may hinder displacement as an inactive portion.

It is preferable that the internal electrode 5 be formed of a conductive metal which is solid at room temperature (about 22° C.). Examples of such a metal include aluminum, titanium, chromium, iron, cobalt, nickel, copper, zinc, niobium, molybdenum, ruthenium, rhodium, silver, tin, tantalum, tungsten, iridium, platinum, gold, and lead, and alloys thereof. In the honeycomb-type piezoelectric/electrostrictive element 100 according to this embodiment, an expensive noble metal such as Pt or Ag/Pd need not be used as the material for the internal electrode 5; therefore, other inexpensive materials can be used as the material for the internal electrode 5.

Figure 3:
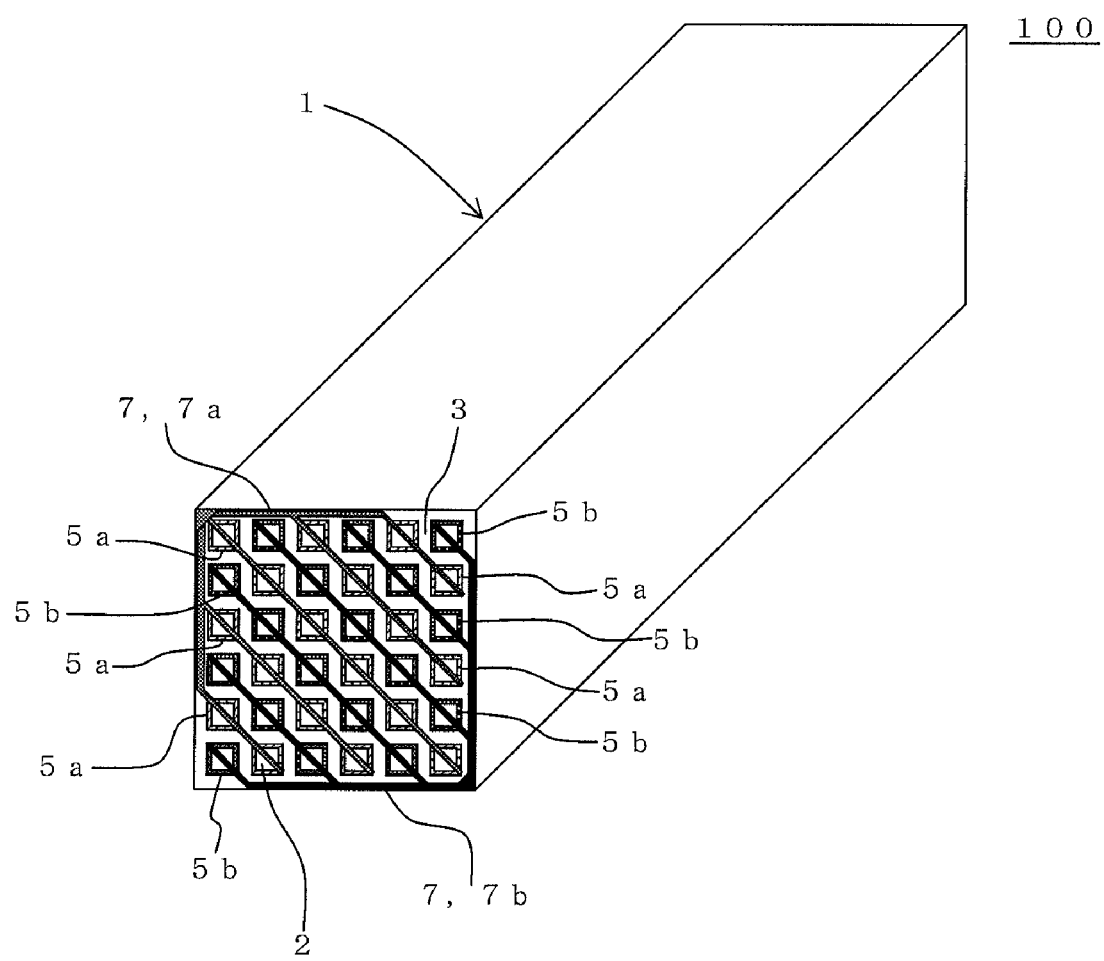
FIG. 3 is an oblique view schematically showing another embodiment of the honeycomb-type piezoelectric/electrostrictive element according to the present invention, showing a state in which the external electrode is disposed on one end face.
Figure 4:
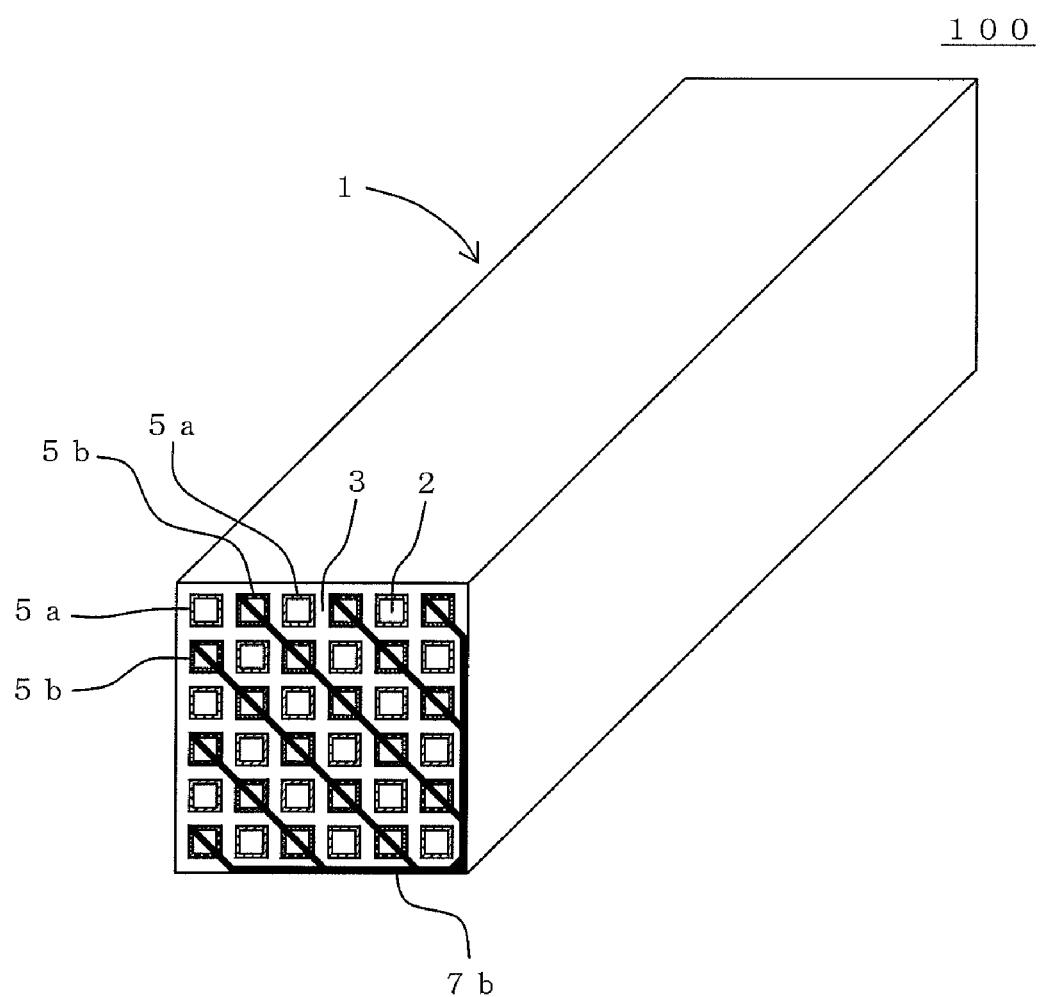
FIG. 4 schematically shows another embodiment of the honeycomb-type piezoelectric/electrostrictive element according to the present invention.

As shown in FIG. 3, the honeycomb-type piezoelectric/electrostrictive element 100 according to this embodiment preferably includes an external electrode 7 (7a) connected to the internal electrodes 5a of one polarity and another external electrode 7 (7b) connected to the internal electrodes 5b of another polarity on one end face of the honeycomb structure section 1, wherein the external electrode 7a and the external electrode 7b preferably make up a pair of external electrodes 7 for applying a voltage. As shown in FIG. 4, the honeycomb structure section 1 may include an external electrode (not shown) connected to the internal electrodes 5a of one polarity on one end face and include another external electrode 7 (7b) connected to the remaining internal electrodes 5b of another polarity on the other end face. In this case also, one external electrode and the other external electrode 7b make up a pair of external electrodes 7 for applying a voltage. FIG. 3 schematically shows another embodiment of the honeycomb-type piezoelectric/electrostrictive element according to the present invention. FIG. 3 is an oblique view showing a state in which the external electrode is disposed on one end face. FIG. 4 schematically shows another embodiment of the honeycomb-type piezoelectric/electrostrictive element according to the present invention. FIG. 4 is an oblique view showing a state in which the external electrodes are disposed on both end faces (one end face is not shown).

The shape of the external electrode 7 is not particularly limited insofar as the external electrode 7 is connected to the internal electrodes of the same polarity. It is preferable that the external electrode 7 be a linear (strip-shaped) electrode disposed on the end face of the honeycomb structure section 1. For example, when the internal electrodes of different polarities (internal electrodes 5a and 5b) are alternately arranged, as shown in FIG. 3, the external electrode 7a is preferably a comb-tooth-shaped electrode formed by connecting linear (strip-shaped) electrodes diagonally connecting the internal electrodes 5a and an L-shaped electrode disposed along the periphery of the end face of the honeycomb structure section 1, and the external electrode 7b is preferably a comb-tooth-shaped electrode formed by connecting linear (strip-shaped) electrodes diagonally connecting the internal electrodes 5b and an L-shaped electrode disposed along the periphery of the end face of the honeycomb structure section 1 (at a position at which the electrode does not overlap the L-shaped electrode of the external electrode 7a). This applies to the case where the external electrodes 7a and 7b are disposed on one end face of the honeycomb structure section 1 and the case where the external electrode 7a is disposed on one end face of the honeycomb structure section 1 and the external electrode 7b is disposed on the other end face. The thickness of the external electrode 7 is not particularly limited. The thickness of the external electrode 7 is preferably 0.1 to 20 µm.

The material for the external electrode 7 is not particularly limited. It is preferable that the external electrode 7 be formed of a conductive metal which is solid at room temperature (about 22° C.). Examples of such a metal include aluminum, titanium, chromium, iron, cobalt, nickel, copper, zinc, niobium, molybdenum, ruthenium, rhodium, silver, tin, tantalum, tungsten, iridium, platinum, gold, and lead, and alloys thereof.

Figure 8A:
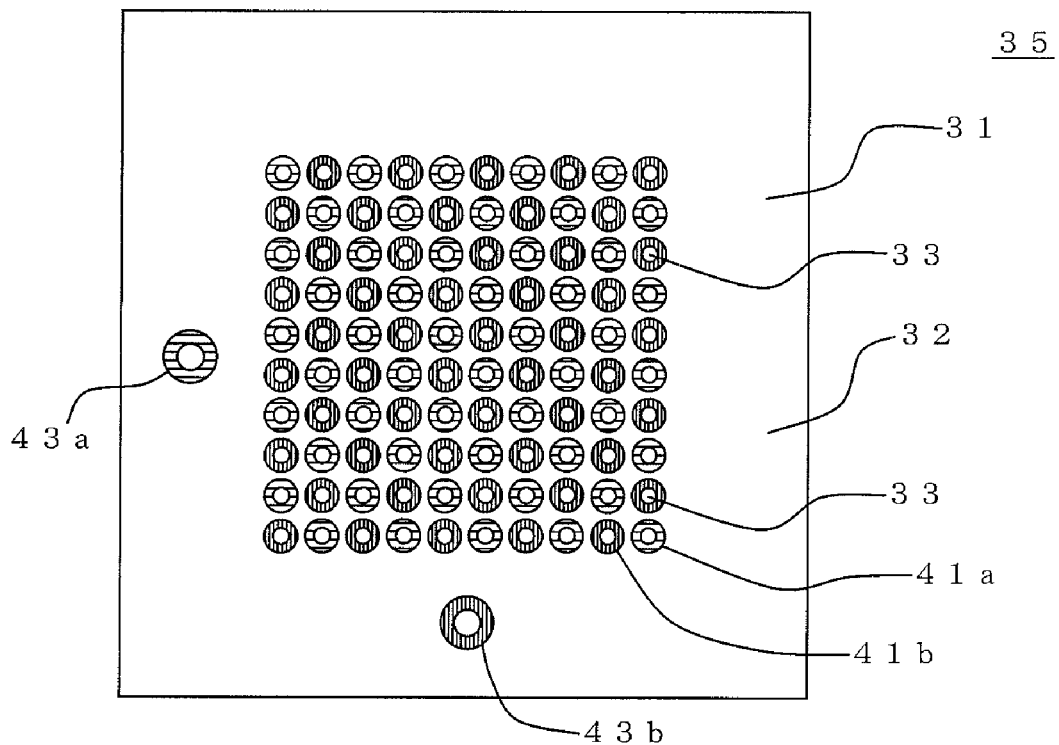
FIG. 8A is a plan view showing a wiring board viewed from the bonding surface side.
Figure 8B:
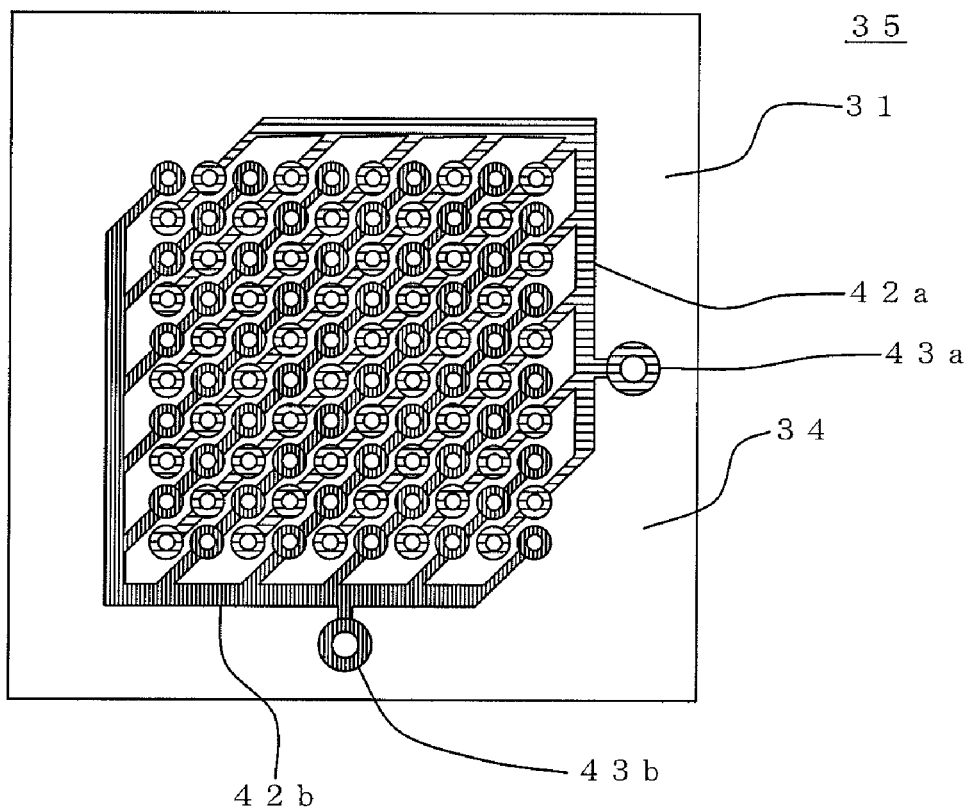
FIG. 8B is a plan view showing the wiring board viewed from the surface side.
Figure 9:
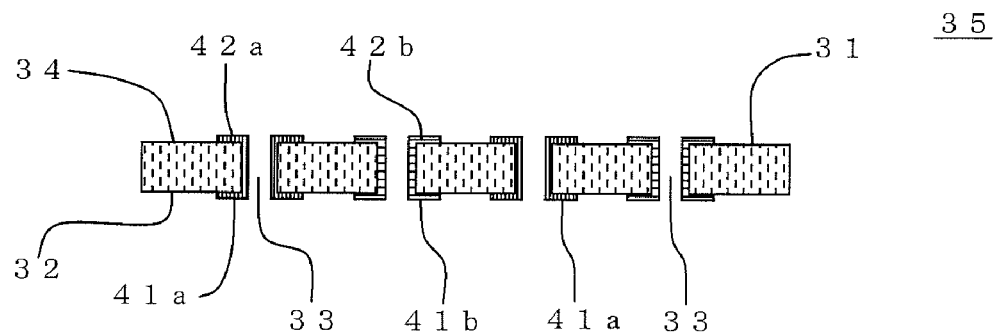
FIG. 9 is a cross-sectional view perpendicular to the bonding surface of the wiring board.

The external electrode may not be directly disposed on the honeycomb structure section. Specifically, an external electrode corresponding to predetermined internal electrodes of one polarity and another external electrode corresponding to the remaining internal electrodes of another polarity may be formed on a substrate to form a wiring board, and the wiring board may be bonded to one end face of the honeycomb structure section in a state in which the predetermined internal electrodes and the external electrode corresponding thereto are electrically connected and the remaining internal electrodes and the external electrode corresponding thereto are electrically connected. These external electrodes make up a pair of external electrodes for applying a voltage. For example, as shown in FIGS. 8A and 8B, there may be used a wiring board 35 which includes a substrate 31 in which through-holes 33 are formed at positions overlapping respective cells when disposed on the end face of the honeycomb structure section 1, and external electrodes are disposed at the positions at which the through-holes 33 are formed. As shown in FIG. 9, bonding surface 32 side (back surface side) external electrodes 41a and 41b and surface 34 side external electrodes 42a and 42b are connected via the through-holes 33. In FIGS. 8A, 8B, and 9, the bonding surface-side external electrode 41a and the surface-side external electrode 42a are portions electrically connected to predetermined internal electrodes of the honeycomb structure section, and the bonding surface-side external electrode 41b and the surface-side external electrode 42b are portions electrically connected to the remaining internal electrodes of the honeycomb structure section. Wires from power supplies or the like are connected to terminals 43a and 43b. FIG. 8A is a plan view of the wiring board 35 viewed from the bonding surface 32, and FIG. 8B is a plan view of the wiring board 35 viewed from the surface 34 (surface opposite to the bonding surface 32). FIG. 9 is a cross-sectional view perpendicular to the bonding surface of the wiring board 35.

As the substrate 41, a known electric wiring substrate may be used. The thickness of the substrate 41 is preferably 0.1 to 3 mm. The size of the through-hole 33 is not particularly limited. It is preferable that the through-hole 33 be smaller than the cross section of the corresponding cell of the honeycomb structure section.

Figure 10:
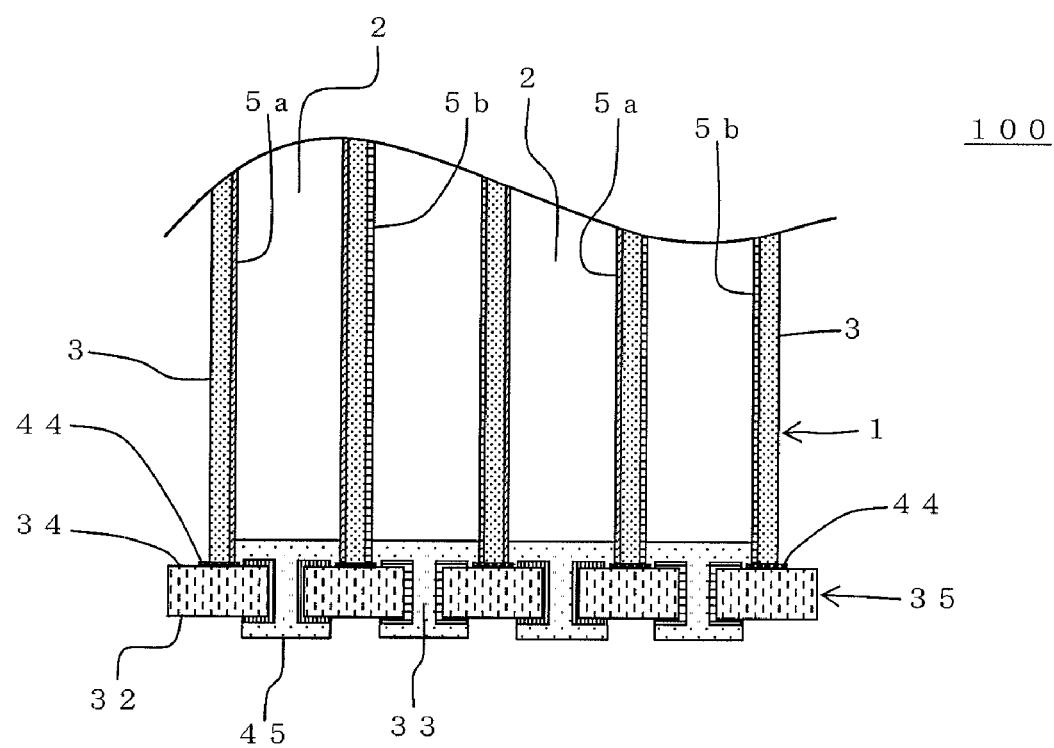
FIG. 10 schematically shows part of another embodiment of the honeycomb-type piezoelectric/electrostrictive element according to the present invention along a plane parallel to the axial direction of the honeycomb structure section.

FIG. 10 is a cross-sectional view along a plane parallel to the axial direction of the honeycomb structure section 1, schematically showing part of the honeycomb-type piezoelectric/electrostrictive element 100 in which the wiring board 35 on which the external electrodes are disposed is attached to the honeycomb structure section 1. As shown in FIG. 10, the honeycomb structure section 1 and the wiring board 35 on which the external electrodes are disposed are bonded so that each cell 2 of the honeycomb structure section 1 overlaps the through-hole 33 in the wiring board 35 corresponding to each cell 2 (the cell 2 communicates with the through-hole 33). The honeycomb structure section 1 and the wiring board 35 are preferably bonded using an adhesive 44. As the adhesive 44, an epoxy resin adhesive, glass (when the wiring board is formed of a ceramic), or the like may be used. It is preferable to use an epoxy resin adhesive. A known epoxy resin adhesive may be used. The adhesive 44 is preferably applied to the wiring board 35 by printing. When electrically connecting predetermined internal electrodes 5a of the honeycomb structure section 1 and the corresponding external electrode disposed on the wiring board 35 and electrically connecting the remaining internal electrodes 5a of the honeycomb structure section 1 and the corresponding external electrode disposed on the wiring board 35, the through-hole 33, in which the external electrode is disposed, and the end of the cell 2 are preferably filled with a conductive material 45, and preferably the external electrode disposed on the wiring board 35 and the internal electrode disposed in the cell 2 are electrically connected through the conductive material 45. The filling state of the conductive material 45 in the through-hole 33 and the end of the cell 2 is not particularly limited. It suffices that the external electrode and the internal electrode be electrically connected. As shown in FIG. 10, for example, the conductive material 45 is preferably provided to close the through-hole 33 and plug the end of the cell 2 (close the entire end of the cell 2). The conductive material 45 may be provided to not entirely close the through-hole 33 and the end of the cell 2. The conductive material 45 is preferably provided by injecting a conductive paste through the through-hole 33 under pressure, and curing the conductive paste. As the conductive paste, there may be used a silver paste, a copper paste, or the like containing an adhesive component which can be used by drying and curing at 200° C. or less. A silver paste is preferably used.

It is preferable that the honeycomb-type piezoelectric/electrostrictive element according to this embodiment include, on one end of the cell, conductive plugging sections contacting the internal electrodes, and that the external electrode and the other external electrode be respectively connected to the predetermined internal electrodes and the remaining internal electrodes through the plugging sections. When connecting the external electrode and the internal electrode, it is necessary to connect the external electrode to the internal electrode exposed on the end of the honeycomb structure section. However, the internal electrode exposed on the end of the honeycomb structure section does not necessarily have a large area. Therefore, when proving the conductive plugging section on the end of the cell and connecting the external electrode and the internal electrode through the plugging section, the external electrode can be connected using the entire end face (surface exposed on the end of the honeycomb structure section) of the plugging section. The thickness of the plugging section is not particularly limited. The thickness of the plugging section is preferably 0.5 to 5 mm.

When disposing one external electrode on one end face of the honeycomb structure section and disposing another external electrode on the other end face of the honeycomb structure section, it is preferable to provide the conductive plugging sections on the end of the cells provided with predetermined internal electrodes on the side on which one external electrode is disposed, and to provide the conductive plugging sections on the end of the cells provided with the remaining internal electrodes on the side on which the other external electrode is disposed. The predetermined internal electrodes are internal electrodes of one polarity, and the remaining internal electrodes are internal electrodes of the other polarity.

The material for the conductive plugging section is not particularly limited. It is preferable that the material for the conductive plugging section contain a conductive metal which is solid at room temperature (about 22° C.). Examples of such a metal include aluminum, titanium, chromium, iton, cobalt, nickel, copper, zinc, niobium, molybdenum, ruthenium, rhodium, silver, tin, tantalum, tungsten, iridium, platinum, gold, and lead, and alloys thereof.

The conductive plugging section may be disposed to completely close the cell, or may be disposed to partially close the cell. The plugging section may be dense or porous. When the plugging section is porous, air enters the cell or is released from the cell through the plugging section, therefore, reliability with respect to a change in external pressure is increased. When the plugging section is dense, factors such as water in external environment which adversely affect the durability of the element can be eliminated.

Figure 5:
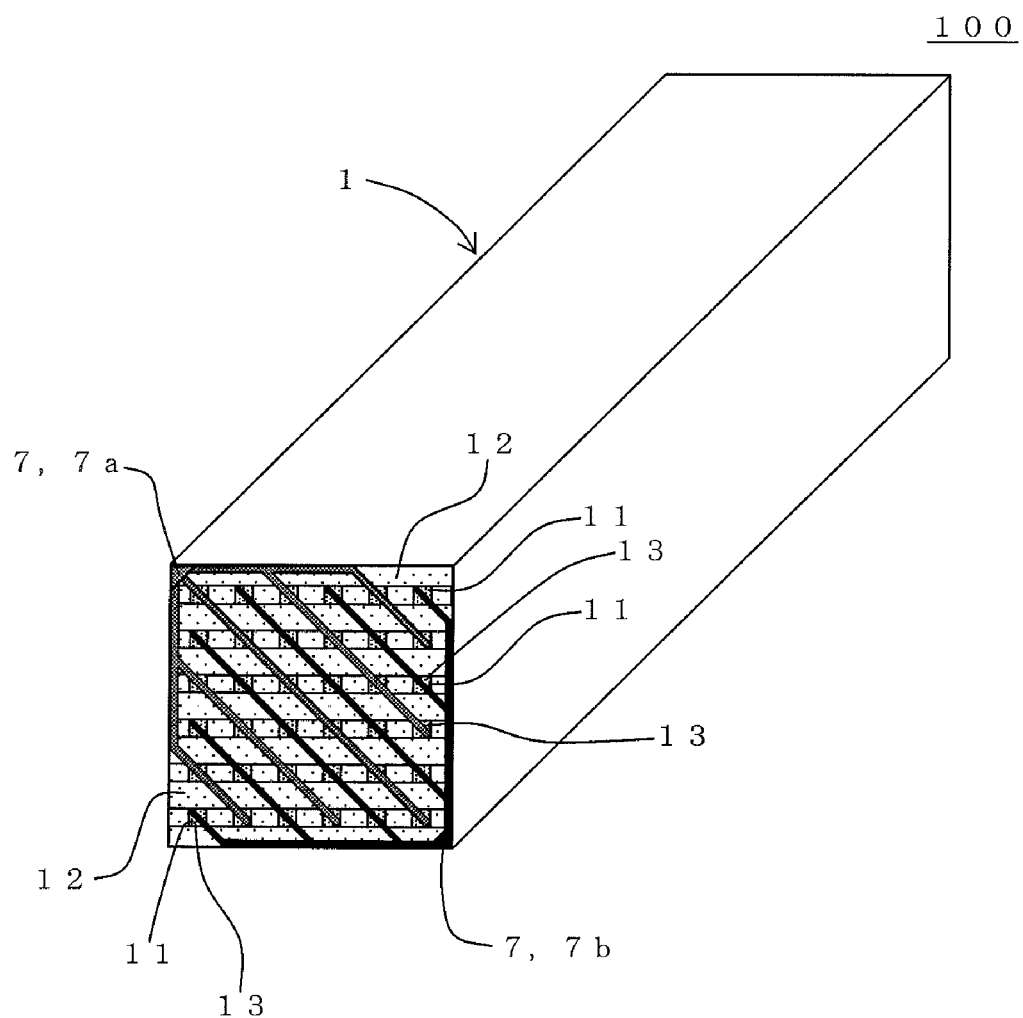
FIG. 5 is an oblique view schematically showing another embodiment of the honeycomb-type piezoelectric/electrostrictive element according to the present invention.

As shown in FIG. 5, the honeycomb-type piezoelectric/electrostrictive element 100 according to this embodiment preferably includes the plugging sections 11 in the end of the cells, and a grid-shaped insulating protective film 12 disposed along the partition wall on the end face of the honeycomb structure section 1 on which the external electrodes 7 (7a and 7b) are disposed so that the insulating protective film 12 covers the partition wall and the internal electrodes and exposes the plugging sections 11. The external electrodes 7 (7a and 7b) are preferably disposed on the surface of the insulating protective film 12 and connected to the plugging sections 11 exposed in openings 13 in the grid-shaped insulating protective film 12. FIG. 5 is an oblique view schematically showing another embodiment of the honeycomb-type piezoelectric/electrostrictive element according to the present invention.

The external electrode 7 can be easily connected to only the plugging sections of the same polarity by disposing the grid-shaped insulating protective film 12 on the end face of the honeycomb structure section 1 so that the insulating protective film 12 covers the partition wall and the internal electrodes and exposes the plugging sections 11. Specifically, in the case where the insulating protective film 12 is not disposed, when connecting the external electrode only to the plugging sections of the same polarity, the external electrode may easily come in contact with the plugging sections of the other polarity since the distance from the adjacent plugging sections of the other polarity is short. In this case, the exposed portion of the plugging sections of the other polarity is reduced by disposing the grid-shaped insulating protective film 12 to cover the partition wall and the internal electrodes, whereby the plugging sections rarely come in contact with the external electrode of the opposite polarity. Therefore, it is preferable that the insulating protective film 12 cover the outer edge portion of the end face of the plugging section in addition to the partition wall and the internal electrode. In this case, it is preferable that the outer edge of the end face of the plugging section be covered to an extent of 20 to 80% of the length of one side.

The material for the insulating protective film 12 is not particularly limited insofar as the material has electric insulating properties. As examples, glass, crystallized glass, a resin, and the like can be given.

Figure 11:
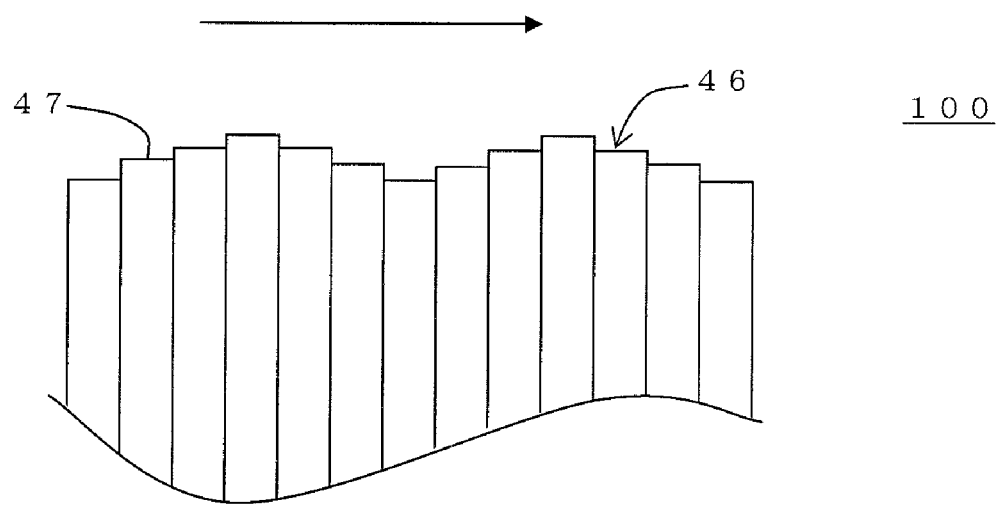
FIG. 11 is a side view illustrative of a state in which the end face portion of another embodiment of the honeycomb-type piezoelectric/electrostrictive element according to the present invention pulsates.

Another embodiment of the honeycomb-type piezoelectric/electrostrictive element according to the present invention includes external electrodes independently connected to the respective internal electrodes on one end face of the honeycomb structure section, wherein a voltage can be independently applied to the respective internal electrodes through the external electrodes. The honeycomb-type piezoelectric/electrostrictive element according to this embodiment is configured in the same manner as the above-described embodiment of the honeycomb-type piezoelectric/electrostrictive element according to the present invention except that a voltage can be independently applied to the respective internal electrodes. In the honeycomb-type piezoelectric/electrostrictive element according to this embodiment, the application of voltage can be controlled in units of internal electrodes. For example, as shown in FIG. 11, an end face 46 of the honeycomb-type piezoelectric/electrostrictive element 100 pulsates by sequentially applying a voltage to the respective internal electrodes at specific time intervals in one direction in which the cells are arranged, whereby the honeycomb-type piezoelectric/electrostrictive element 100 can be used as a pump utilizing such a pulsatory motion. FIG. 11 is a side view illustrative of a state in which the end face 46 of the honeycomb-type piezoelectric/electrostrictive element 100 pulsates. The arrangement of each cell 47 is illustrated in FIG. 11. Each cell sequentially expands and contracts so that a wave is formed in the direction in which the cells 47 are arranged (one direction in which the cells are arranged).

Figure 12:
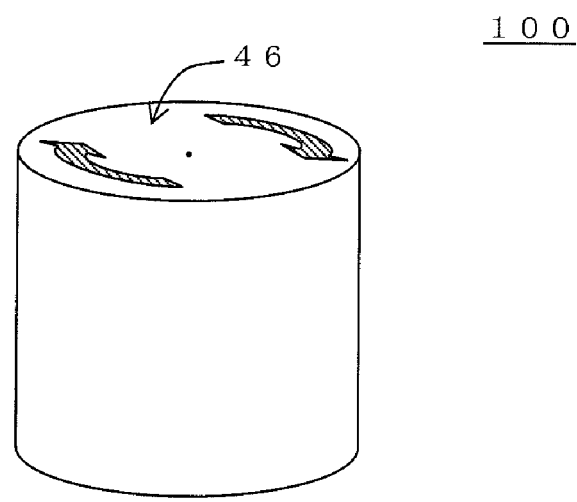
FIG. 12 is an oblique view illustrative of a state in which the end face portion of another embodiment of the honeycomb-type piezoelectric/electrostrictive element according to the present invention pulsates to turn.

As shown in FIG. 12, in the honeycomb-type piezoelectric/electrostrictive element 100 according to this embodiment, a voltage can be applied to each internal electrode so that the end face 46 pulsates in the direction in which the wave moves (turns) around the central portion of the end face 46. This enables the honeycomb-type piezoelectric/electrostrictive element according to this embodiment to be used as a rotary motor. FIG. 12 is an oblique view illustrative of a state in which the end face 46 of the honeycomb-type piezoelectric/electrostrictive element 100 pulsates to make a turn.

A method of producing the honeycomb-type piezoelectric/electrostrictive element according to the present invention is described below. The honeycomb-type piezoelectric/electrostrictive element according to the present invention may be produced using the following method, for example. Note that the method of producing the honeycomb-type piezoelectric/electrostrictive element according to the present invention is not limited to the following method. The following description provides a method of producing the honeycomb-type piezoelectric/electrostrictive element 100 shown in FIG. 5 in which the plugging sections 11, the insulating protective film 12, and two external electrodes 7 (7a and 7b) of different polarities are disposed on one end face of the honeycomb structure section 1.

First, clay for forming the honeycomb structure section 1 is prepared. Specifically, a raw material mentioned above as the material for the partition wall 3 of the honeycomb structure section 1 is mixed and kneaded to prepare a clay. For example, a dispersion medium such as water or an organic solvent, an organic binder, a dispersant, and the like are added to a powdered raw material such as lead zirconate titanate to provide a raw material for forming. The raw material for forming is kneaded to prepare a clay.

As the organic binder, hydroxypropylmethylcellulose, methylcellulose, hydroxyethylcellulose, carboxymethylcellulose, polyvinyl alcohol, or the like may be used. These organic binders may be used either individually or in combination of two or more.

As the dispersant, ethylene glycol, dextrin, fatty acid soap, polyalcohol, or the like may be used. These dispersants may be used either individually or in combination of two or more.

When using an organic solvent as the dispersion medium, it is preferable to use an organic solvent such as an alcohol. As the organic solvent, terpineol may be used, for example. In this case, polyvinyl butyral may be used as the organic binder.

The method of preparing clay by kneading the raw material for forming is not particularly limited. As an example, a method using a kneader, a vacuum pug mill, or the like can be given.

The resulting clay is formed into a honeycomb shape to prepare a honeycomb formed body. The method of preparing the honeycomb formed body is not particularly limited. A known forming method such as extrusion forming, injection forming, or press forming may be used. In particular, a method in which the clay prepared as described above is extruded using a die with the desired cell shape, partition wall thickness, and cell density and the like can be given as a suitable example.

Figure 7A:
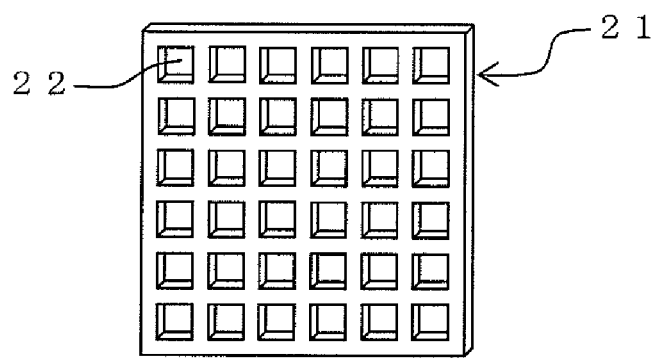
FIG. 7A is an oblique view schematically showing a green sheet in the process of forming the honeycomb structure section of the honeycomb-type piezoelectric/electrostrictive element according to the present invention.
Figure 7B:
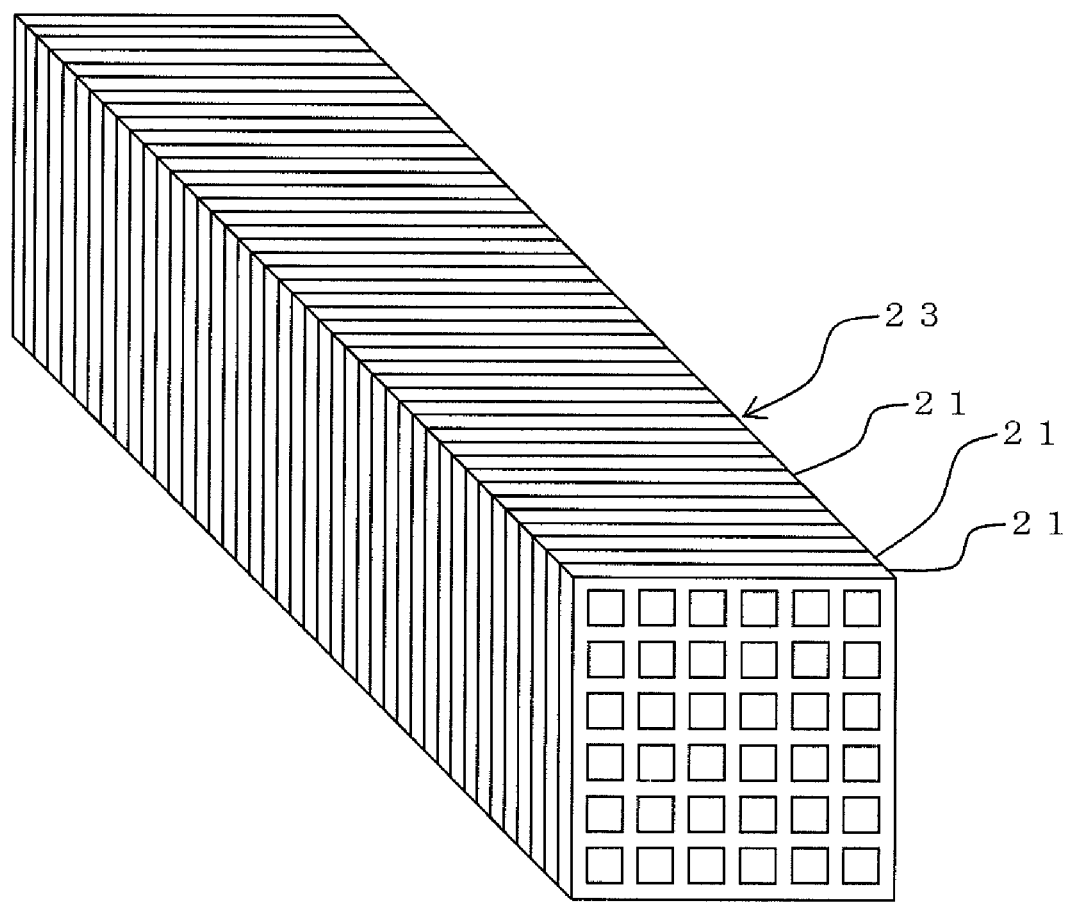
FIG. 7B is an oblique view schematically showing a state in which green sheets are stacked in the process of forming the honeycomb structure section of the honeycomb-type piezoelectric/electrostrictive element according to the present invention.

A slurry prepared by mixing the raw material and an organic solvent containing a binder may be formed using a doctor blade method or the like to form a green sheet 21 in which a plurality of through-holes 22 forming cells are provided, as shown in FIG. 7A, and the resulting green sheets 21 may be stacked, as shown in FIG. 7B, to form a honeycomb formed body 23. FIGS. 7A and 7B schematically show the process of forming the honeycomb structure section of the honeycomb-type piezoelectric/electrostrictive element according to the present invention. FIG. 7A is an oblique view showing the green sheet, and FIG. 7B is an oblique view showing a state in which the green sheets are stacked.

Next, the resulting honeycomb formed body is preferably dried to obtain a honeycomb dried body. The drying method is not particularly limited. For example, a known drying method such as hot-blast drying, microwave drying, dielectric drying, drying under reduced pressure, vacuum drying, or freeze drying may be used. In particular, a drying method using hot-blast drying and microwave drying or dielectric drying in combination is preferable since the entire formed body can be dried quickly and uniformly.

Then, the resulting honeycomb dried body may be calcined to form a calcined body before firing. The term "calcining" refers to an operation of removing the organic substance such as organic binder and dispersant in the honeycomb formed body by means of combustion. The calcining temperature may be about 200 to 800° C. The calcining time is not particularly limited. The calcining time is usually about 10 to 100 hours.

Figure 6A:
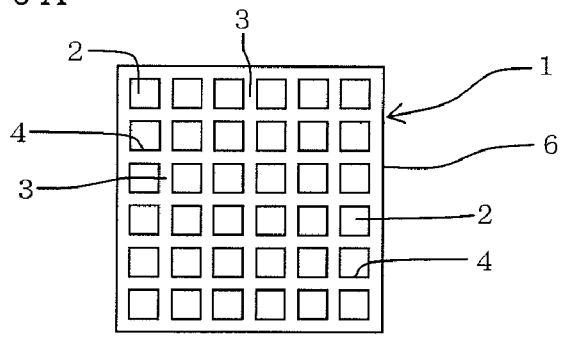
FIG. 6A is a front view schematically showing a production process of one embodiment of a method of producing the honeycomb-type piezoelectric/electrostrictive element according to the present invention, viewed from one end face side of the honeycomb structure section.

Subsequently, the resulting calcined body is fired to obtain a honeycomb structure section 1 as shown in FIG. 6A. The term "firing" refers to an operation of densifying the raw material for forming in the calcined body by sintering to ensure a specific strength. The firing conditions (temperature and time) may be appropriately selected depending on the type of the raw material for forming. FIGS. 6A to 6E schematically show a production process of one embodiment of the method of producing the honeycomb-type piezoelectric/electrostrictive element according to the present invention. FIGS. 6A to 6E are front views showing one end face of the honeycomb structure section.

Figure 6B:
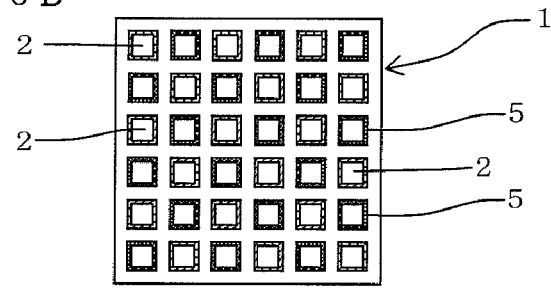
FIG. 6B is a front view schematically showing a production process of one embodiment of the method for producing the honeycomb-type piezoelectric/electrostrictive element according to the present invention, viewed from one end face side of the honeycomb structure section.

As shown in FIG. 6B, the internal electrode 5 is disposed on the inner wall surface 4 of the cell 2 of the honeycomb structure section 1 to cover the entire inner wall surface 4. The internal electrode 5 is preferably disposed over the entire inner wall surface 4. Note that the internal electrode 5 may be disposed on part of the inner wall surface 4. As the internal electrode 5, the above-mentioned material such as silver or copper may be used. The method of disposing the internal electrode 5 is not particularly limited. For example, the internal electrode 5 may be disposed using the following method. First, a metal used as the material for the internal electrode 5 is powdered. Then, a solvent such as an alcohol, an organic binder, and the like are added to the metal powder to prepare a slurry. The slurry concentration is preferably 50 to 80% by mass. The viscosity of the slurry is preferably 0.05 to 50 Pa·s. The honeycomb structure section 1 is immersed in the slurry so that the slurry adheres to the inner wall surfaces 4 of the cells 2. The resulting product is then heated at 600 to 900° C. to form film-shaped internal electrodes 5 to cover the entire inner wall surfaces. In this case, when the slurry adheres to the inner wall surfaces 4 of the cells 2, it is preferable that the slurry efficiently adheres to the inner wall surfaces 4 of the cells 2 by absorbing the slurry from the partition wall side. A mask may be provided on the periphery of the honeycomb structure section 1 and the partition wall on the end face so that the slurry does not adhere to the portion of the honeycomb structure section 1 other than the inner wall surfaces of the cells.

Plating, sputtering, or the like may be used instead of the above method. It is preferable to polish the end face to some extent to expose the ceramic portion on the end face of the partition wall so that the internal electrodes 5 disposed on the inner wall surfaces 4 of the adjacent cells 2 are not electrically connected.

Figure 6C:
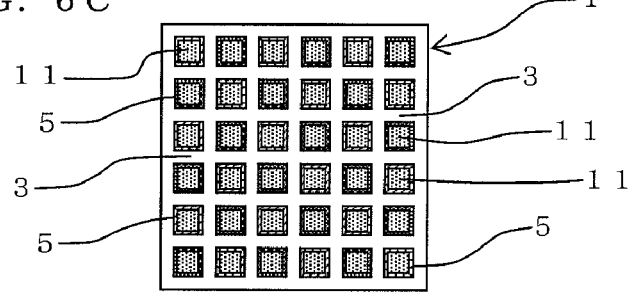
FIG. 6C is a front view schematically showing a production process of one embodiment of the method for producing the honeycomb-type piezoelectric/electrostrictive element according to the present invention, viewed from one end face side of the honeycomb structure section.

As shown in FIG. 6C, it is preferable to dispose the plugging sections 11 on one end face of the honeycomb structure section 1 in which the internal electrodes 5 are disposed. The method of disposing the plugging sections 11 is not particularly limited. For example, when disposing two external electrodes of different polarities on one end of the honeycomb structure section, a plugging slurry (or plugging paste) containing a metal raw material powder, water or an organic solvent such as an alcohol, and an organic binder used for the plugging sections is stored in a storage container. The slurry concentration is preferably 50 to 90% by mass. The viscosity of the slurry is preferably 5 to 5000 Pa·s. One end of the honeycomb structure section 1 in which the internal electrodes 5 are disposed is immersed in the plugging slurry in the storage container to fill the openings of the cells 2 with the plugging slurry to form the plugging sections 11. When disposing one external electrode on one end face of the honeycomb structure section and disposing another external electrode of a different polarity on the other end face of the honeycomb structure section, it is preferable to provide a mask in the cells on each end in which the internal electrode not connected to the external electrode is disposed, and fill the openings of the cells 2 with the plugging slurry using the above method to form the plugging sections 11. The thickness of the plugging section disposed is not particularly limited. The thickness of the plugging section is preferably 0.5 to 5 mm. When disposing one external electrode on one end face of the honeycomb structure section and disposing another external electrode of a different polarity on the other end face of the honeycomb structure section, the plugging sections 11 may be disposed in the openings of all the cells on each end of the honeycomb structure section without providing the mask in order to improve workability.

Figure 6D:
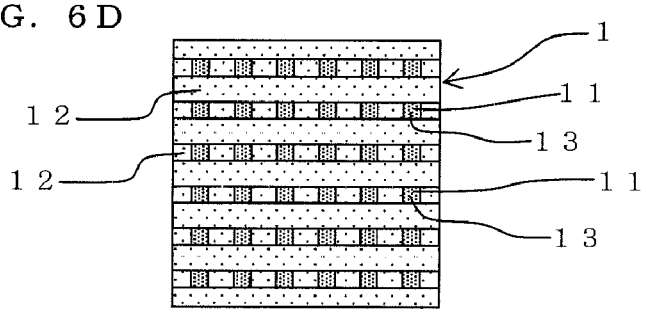
FIG. 6D is a front view schematically showing a production process of one embodiment of the method for producing the honeycomb-type piezoelectric/electrostrictive element according to the present invention, viewed from one end face side of the honeycomb structure section.

As shown in FIG. 6D, it is preferable to dispose the grid-shaped insulating protective film 12 along the partition wall 3 (see FIG. 6C) on the end face of the honeycomb structure section 1 on which the plugging sections 11 are disposed so that the insulating protective film 12 covers the partition wall 3 (see FIG. 6C) and the internal electrodes 5 (see FIG. 6C) and expose the plugging sections 11. The method of disposing the insulating protective film 12 is not particularly limited. It is preferable to dispose the insulating protective film 12 by printing the above-mentioned material having electric insulating properties on the end face of the honeycomb structure section 1. As examples of other methods, punched sheet bonding, brush painting, plating, and sputtering can be given.

Figure 6E:
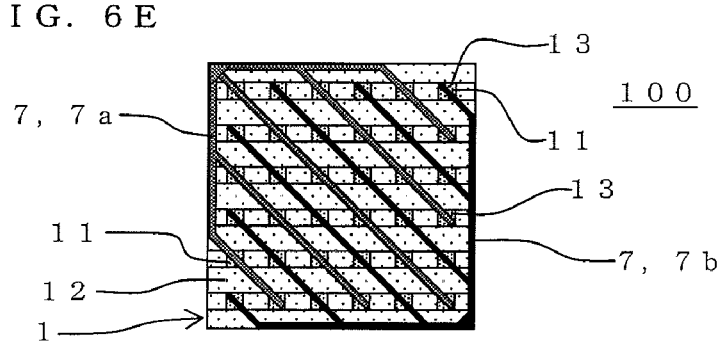
FIG. 6E is a front view schematically showing a production process of one embodiment of the method for producing the honeycomb-type piezoelectric/electrostrictive element according to the present invention, viewed from one end face side of the honeycomb structure section.

As shown in FIG. 6E, it is preferable to dispose the external electrodes 7 (7a and 7b) on the surface of the insulating protective film 12 and connect to the plugging sections 11 of the same polarity exposed in the openings 13d to obtain a honeycomb-type piezoelectric/electrostrictive element 100. The term "plugging sections of the same polarity" refer to the plugging sections coming in contact with the internal electrodes of the same polarity. The method of disposing the external electrodes 7 (7a and 7b) is not particularly limited. It is preferable to dispose the external electrodes 7 (7a and 7b) by printing the above-mentioned material which may be used for the external electrodes 7 on the surface of the insulating protective film 12 and the surfaces of the plugging sections of the same polarity on one end face of the honeycomb structure section 1. As examples of other methods, punched sheet bonding, brush painting, plating, and sputtering can be given. In the honeycomb-type piezoelectric/electrostrictive element shown in FIG. 6E, the plugging sections (internal electrodes) of different polarities are disposed alternately. When disposing one of the external electrodes 7 (7a and 7b) on one end of the honeycomb structure section and disposing the other of the external electrodes 7 (7a and 7b) on the other end of the honeycomb structure section, it is preferable to dispose the external electrodes 7 at specific positions by printing or the like.

A pair of external electrodes may be disposed on one honeycomb structure section to form a honeycomb-type piezoelectric/electrostrictive element, as shown in FIG. 6E. A honeycomb structure which may be cut into a plurality of honeycomb structure sections may be formed, a pair of external electrodes as shown in FIG. 6E may be formed on the end face of the honeycomb structure at a plurality of positions (a plurality of pairs), and the honeycomb structure may be cut to obtain a plurality of honeycomb-type piezoelectric/electrostrictive elements in which a pair of external electrodes is disposed. After forming the above honeycomb structure, the honeycomb structure may be cut into a plurality of honeycomb structure sections, and the internal electrodes, the plugging sections, the insulating protective film, and the external electrodes may be disposed thereafter. The honeycomb structure section may be appropriately processed in the production steps of the honeycomb-type piezoelectric/electrostrictive element.

EXAMPLES

The present invention is described below in more detail by way of examples. Note that the present invention is not limited to the following examples.

Example 1

Preparation of Raw Material for Forming

NiO (nickel oxide) was added to a powder raw material containing 15 mol % of PMN (lead magnesium niobate), 45 mol % of PT (lead titanate), and 40 mol % of PZ (lead zirconate) as the main components in an amount of 0.5 parts by mass for 100 parts by mass of the powder raw material to obtain a ceramic synthetic raw material (piezoelectric powder). The average particle diameter of the resulting piezoelectric powder was 0.5 µm. The average particle diameter was measured using dynamic light scattering photometer DSL7000 manufactured by Otsuka Electronics Co., Ltd. Methylcellulose as a binder, ethylene glycol as a plasticizer, and an appropriate amount of water were added to the piezoelectric powder to obtain a clayey raw material for forming.

(Forming)

The resulting raw material for forming was extruded to obtain a honeycomb formed body. A die had a honeycomb shape with a wall thickness of 50 µm at a pitch of 400 µm. The area of the die was about 10×10 mm (number of cells: 25×25). The resulting honeycomb formed body was cut to a length of about 40 mm.

(Firing)

The resulting honeycomb formed body was degreased in air at 600° C. for five hours, and then fired at 1250° C. for two hour in a sealed sheath. In this case, 5 g of a piezoelectric powder having the same composition as the above piezoelectric powder was placed at the bottom of the sheath having dimensions of 10×10×8 cm, and covered with a lid. The honeycomb formed body was fired in an airtight state. The honeycomb was densely sintered to obtain a honeycomb sintered body (honeycomb structure section) with a wall thickness of 40 μm at a pitch of 320 μm.

(Formation of Internal Electrode)

The resulting honeycomb sintered body (honeycomb structure section) was completely immersed in a low-viscosity silver (Ag) slurry (viscosity: 0.05 to 0.1 Pa·s) to coat the wall surfaces of the cells with the slurry. After drying, the honeycomb sintered body was heated at 700° C. by using a belt furnace to form silver (Ag) internal electrodes on the inner wall surfaces of the cells. The resulting sample was cut so that the number of cells was 20×20.

(Plugging Section)

One end of the honeycomb structure section was immersed in a high-viscosity silver (Ag) paste (viscosity: 300 to 500 Pa·s) to a depth of about 2 mm. The honeycomb structure section was then dried and fired to form plugging sections. As the silver paste, a paste prepared by adding terpineol and polyvinyl butyral to a silver powder was used. The end face of the honeycomb structure section was polished to some extent to expose the ceramic on the end face of the partition wall so that the silver (Ag) internal electrodes disposed on the inner wall surfaces of the adjacent cells were not electrically connected. The other end face of the honeycomb structure section was cut so that the length (length in the central axis direction) of the element was 32 mm.

(Insulating Protective Film)

A grid-shaped insulating protective film was disposed to the end face on which the plugging sections were formed. An insulating glass paste was used to form the insulating protective film. The insulating glass paste was printed on the end face of the honeycomb structure section at the same pitch as the partition wall so that the end face of the partition wall and the end of the internal electrodes were covered. The line width was set at 200 μm so that about 150×150 μm of the end face of the silver (Ag) plugging section disposed in each cell was exposed.

(External Electrode)

A pair of silver (Ag) external electrodes was printed in the shape of combteeth on the end face of the honeycomb structure section on which the plugging sections and the insulating protective film were disposed so that each line extended diagonally and a voltage was applied to the cells adjacent through the partition wall to obtain a honeycomb-type piezoelectric/electrostrictive element. A lead wire was connected to each external electrode.

(Characteristic Evaluation)

A displacement when applying a voltage of 200 V to the pair of external electrodes was measured using a laser displacement meter. A displacement (amount of contraction) of 45 μm was confirmed in the central axis direction. The generative force (blocking force) was estimated to be about 1000 N (newton). A displacement similar to that of a stacked actuator with an equal size and electric capacity was obtained. Breakage of the element or deterioration in characteristics was not observed after one hundred million cycles.

Example 2

Preparation of Raw Material for Forming to Formation of Internal Electrode

A honeycomb sintered body (honeycomb structure section) wherein internal electrodes were formed was fabricated in the same manner as in Example 1.

(Wiring Board)

A wiring board shown in FIGS. 8A, 8B, and 9 was fabricated. A glass epoxy substrate was used as the substrate. Through-holes of 20×20 with a diameter of 0.15 mm were formed in the substrate at intervals of 0.32 mm. A bonding surface side external electrode, a surface side external electrode, and a terminal were formed to be connected in the through-holes. The external electrodes and the terminal were formed by means of forming a pattern by etching a copper printed circuit board, forming through-holes using a drill, and copper-plating the through-holes.

(Bonding Honeycomb Sintered Body and Wiring Board)

The honeycomb sintered body and the wiring board were bonded so that the internal electrodes and the external electrodes were electrically connected to obtain a honeycomb-type piezoelectric/electrostrictive element. Specifically, an epoxy resin adhesive was applied to the wiring board by printing. As shown in FIG. 10, the honeycomb sintered body (honeycomb structure section 1) and the wiring board 35 were bonded through the epoxy resin adhesive. A silver paste was injected via through-holes 33 using a syringe to fill the through-holes and end of the cells with the silver paste to electrically connect the external electrodes and the internal electrodes. A lead wire was connected to the terminal.

(Characteristic Evaluation)

A displacement when applying a voltage of 200 V to the pair of external electrodes was measured using a laser displacement meter. Results similar to those of Example 1 were obtained.

The present invention may be suitably applied to actuator elements such as a fuel injection valve actuator for a diesel engine and a precise positioning actuator, and sensor elements for various sensors such as an ultrasonic sensor, an acceleration sensor, an angular velocity sensor, an impact sensor, and a mass sensor.

What is claimed is:

1. A honeycomb-type piezoelectric/electrostrictive element comprising:
   a honeycomb structure section having a partition wall which partitions cells passing through the honeycomb structure section in an axial direction; and
   an internal electrode, disposed on an inner wall surface of the cell, to internally cover the entire inner wall surface;
   wherein the partition wall is formed of a piezoelectric/electrostrictive body, and wherein the honeycomb structure section is deformed by applying a voltage between the electrodes disposed in the cells adjacent through the partition wall.

2. The honeycomb-type piezoelectric/electrostrictive element according to claim 1, wherein the internal electrodes are disposed in all of the cells so that a voltage can be applied between all of the cells adjacent through the partition wall.

3. The honeycomb-type piezoelectric/electrostrictive element according to claim 2, further comprising an external electrode connected to predetermined internal electrodes of the same polarity and another external electrode connected to the remaining internal electrodes of the same polarity on one end face of the honeycomb structure section, wherein the external electrode and the other external electrode make up a pair of external electrodes for applying a voltage.

4. The honeycomb-type piezoelectric/electrostrictive element according to claim 3, further comprising conductive plugging sections contacting the internal electrodes and provided on one end of the cells, wherein the external electrode and the other external electrode are respectively connected to the predetermined internal electrodes and the remaining internal electrodes through the plugging sections.

5. The honeycomb-type piezoelectric/electrostrictive element according to claim 3, further comprising a grid-shaped insulating protective film disposed along the partition wall on the end face of the honeycomb structure section on which the external electrode is disposed so that the insulating protective film covers the partition wall and the internal electrodes and exposes the plugging sections, wherein the external electrode is disposed on the surface of the insulating protective film and connected to the plugging sections exposed in openings in the grid-shaped insulating protective film.

6. The honeycomb-type piezoelectric/electrostrictive element according to claim 3, wherein the predetermined internal electrodes of the same polarity and the remaining internal electrodes of the same polarity are arranged alternately.

7. The honeycomb-type piezoelectric/electrostrictive element according to claim 2, further comprising a wiring board including an external electrode corresponding to predetermined internal electrodes of the same polarity and another external electrode corresponding to the remaining internal electrodes of the same polarity, the wiring board being disposed on one end face of the honeycomb structure section in a state in which the predetermined internal electrodes and the external electrode corresponding to the predetermined internal electrodes are electrically connected and the remaining internal electrodes and the external electrode corresponding to the remaining internal electrodes are electrically connected, wherein the external electrode and the other external electrode make up a pair of external electrodes for applying a voltage.

8. The honeycomb-type piezoelectric/electrostrictive element according to claim 2, further comprising external electrodes independently connected to the respective internal electrodes on one end face of the honeycomb structure section, wherein a voltage can be independently applied to the respective internal electrodes through the external electrodes.

9. The honeycomb-type piezoelectric/electrostrictive element according to claim 1, further comprising an external electrode connected to predetermined internal electrodes of the same polarity, and another external electrode connected to the remaining internal electrodes of the same polarity on one end face of the honeycomb structure section, wherein the external electrode and the other external electrode make up a pair of external electrodes for applying a voltage.

10. The honeycomb-type piezoelectric/electrostrictive element according to claim 9, further comprising conductive plugging sections contacting the internal electrodes and provided on one end of the cells, wherein the external electrode and the other external electrode are respectively connected to the predetermined internal electrodes and the remaining internal electrodes through the plugging sections.

11. The honeycomb-type piezoelectric/electrostrictive element according to claim 9, wherein the predetermined internal electrodes of the same polarity and the remaining internal electrodes of the same polarity are arranged alternately.

12. The honeycomb-type piezoelectric/electrostrictive element according to claim 1, wherein the honeycomb structure section includes an external electrode connected to predetermined internal electrodes of the same polarity on one end face and another external electrode connected to the remaining internal electrodes of the same polarity on the other end face, and the external electrode and the other external electrode make up a pair of external electrodes for applying a voltage.

13. The honeycomb-type piezoelectric/electrostrictive element according to claim 12, further comprising conductive plugging sections contacting the internal electrodes and provided on ends of the cells in which the predetermined internal electrodes are disposed on the side on which the external electrode is disposed, the external electrode being connected to the predetermined internal electrodes through the plugging sections, and conductive plugging sections contacting the internal electrodes and provided on ends of the cells in which the remaining internal electrodes are disposed on the side on which the other external electrode is disposed, and the other external electrode being connected to the remaining internal electrodes through the plugging sections.

14. The honeycomb-type piezoelectric/electrostrictive element according to claim 13, further comprising a grid-shaped insulating protective film disposed along the partition wall on the end face of the honeycomb structure section on which the external electrode is disposed so that the insulating protective film covers the partition wall and the internal electrodes and exposes the plugging sections, wherein the external electrode is disposed on the surface of the insulating protective film and connected to the plugging sections exposed in openings in the grid-shaped insulating protective film.

15. The honeycomb-type piezoelectric/electrostrictive element according to claim 1, further comprising a wiring board including an external electrode corresponding to predetermined internal electrodes of the same polarity and another external electrode corresponding to the remaining internal electrodes of the same polarity, the wiring board being disposed on one end face of the honeycomb structure section in a state in which the predetermined internal electrodes and the external electrode corresponding to the predetermined internal electrodes are electrically connected and the remaining internal electrodes and the external electrode corresponding to the remaining internal electrodes are electrically connected, wherein the external electrode and the other external electrode make up a pair of external electrodes for applying a voltage.

16. The honeycomb-type piezoelectric/electrostrictive element according to claim 1, further comprising external electrodes independently connected to the respective internal electrodes on one end face of the honeycomb structure section, wherein a voltage can be independently applied to the respective internal electrodes through the external electrodes.

17. The honeycomb-type piezoelectric/electrostrictive element according to claim 1, wherein the cross-sectional shape of the cell perpendicular to its longitudinal direction is a quadrangle having corners rounded in an arc shape.

18. The honeycomb-type piezoelectric/electrostrictive element according to claim 1, wherein the partition wall has a thickness of 20 to 500 µm.

19. The honeycomb-type piezoelectric/electrostrictive element according to claim 1, wherein the honeycomb structure section is one formed by either extruding a raw material for forming containing a piezoelectric/electrostrictive material as a main component, and firing the extruded product, or by stacking green sheets containing a piezoelectric/electrostrictive material as a main component, and firing the stacked green sheets.

20. The honeycomb-type piezoelectric/electrostrictive element according to claim 1, wherein the internal electrode has a thickness of 0.05 to 5 µm.

* * * * *